(12) United States Patent
Bang

(10) Patent No.: US 12,278,130 B2
(45) Date of Patent: Apr. 15, 2025

(54) SUBSTRATE STORING AND ALIGNING APPARATUS IN SUBSTRATE BONDING EQUIPMENT FOR BONDING SUBSTRATES TO EACH OTHER

(71) Applicant: SEMES CO., LTD., Cheonan-si (KR)

(72) Inventor: Ho Cheon Bang, Asan-si (KR)

(73) Assignee: SEMES CO., LTD., Cheonan-si (KR)

( * ) Notice: Subject to any disclaimer, the term of this patent is extended or adjusted under 35 U.S.C. 154(b) by 440 days.

(21) Appl. No.: 17/562,975

(22) Filed: Dec. 27, 2021

(65) Prior Publication Data

US 2022/0208586 A1     Jun. 30, 2022

(30) Foreign Application Priority Data

Dec. 29, 2020   (KR) .................. 10-2020-0185934

(51) Int. Cl.
*H01L 21/68* (2006.01)
*B65G 47/90* (2006.01)
(Continued)

(52) U.S. Cl.
CPC ............ *H01L 21/681* (2013.01); *B65G 47/90* (2013.01); *H01L 21/67346* (2013.01); *H01L 21/68707* (2013.01)

(58) Field of Classification Search
CPC ............ H01L 21/681; H01L 21/67346; H01L 21/68707; H01L 21/67092; H01L 21/67109; H01L 21/67748; H01L 21/68; H01L 21/67769; H01L 21/67259; H01L 21/67276; H01L 21/67706; H01L 21/67178; H01L 21/67253;
(Continued)

(56) References Cited

U.S. PATENT DOCUMENTS

2012/0132228 A1*  5/2012  Yanai .............. H01J 37/32633
                                                                              134/1.2
2018/0141762 A1    5/2018  Caveney
(Continued)

FOREIGN PATENT DOCUMENTS

CN      104221136 B   *   5/2017   .......... B25J 11/0095
CN      107068601 A   *   8/2017   ....... H01L 21/67017
(Continued)

OTHER PUBLICATIONS

Office Action from the Korean Intellectual Property Office dated May 8, 2023.
(Continued)

*Primary Examiner* — Mohammed Shamsuzzaman

(57) ABSTRACT

A substrate storing and aligning apparatus is proposed. The substrate storing and aligning apparatus is capable of efficiently using space in substrate bonding equipment. The substrate storing and aligning apparatus in the substrate bonding equipment for bonding substrates includes a front end buffer including a front end storing slot configured to temporarily store a substrate, and a front end opening configured such that a transfer robot is movable therethrough to transfer the substrate from the front end storing slot, and a front end aligner provided to be stacked on an upper portion of the front end buffer, and configured to rotate the substrate so as to align the substrate.

6 Claims, 6 Drawing Sheets

(51) Int. Cl.
*H01L 21/673* (2006.01)
*H01L 21/687* (2006.01)

(58) Field of Classification Search
CPC ......... H01L 21/67303; H01L 21/67718; H01L 21/67766; H01L 21/67775; H01L 21/68764; B65G 47/90; G01B 11/0616; G01B 2210/56
See application file for complete search history.

(56) References Cited

U.S. PATENT DOCUMENTS

| | | | |
|---|---|---|---|
| 2019/0198362 A1* | 6/2019 | Lindner | .............. H01L 21/2007 |
| 2019/0385870 A1 | 12/2019 | Lindner | |
| 2021/0225803 A1* | 7/2021 | Von Känel | .............. H01L 24/75 |

FOREIGN PATENT DOCUMENTS

| | | | | | |
|---|---|---|---|---|---|
| CN | 109923657 | A | * | 6/2019 | ....... H01L 21/67265 |
| JP | 2005202431 | A | * | 7/2005 | ......... B32B 38/1841 |
| JP | 2006189886 | A | * | 7/2006 | ......... B32B 38/1841 |
| JP | 2014-063791 | | | 4/2014 | |
| JP | 2019-129286 | | | 8/2019 | |
| KR | 10-2019-0009861 | | | 1/2019 | |
| TW | 201436042 | | | 9/2014 | |
| TW | 201633424 | | | 9/2016 | |
| TW | 201724304 | A | * | 7/2017 | ........... H01L 21/324 |
| TW | 201802867 | | | 1/2018 | |
| TW | 202015154 | | | 4/2020 | |
| WO | 2018-062467 | | | 4/2018 | |

OTHER PUBLICATIONS

Office Action from the Taiwan Intellectual Property Office dated May 6, 2023.

* cited by examiner

SUBSTRATE STORING AND ALIGNING APPARATUS IN SUBSTRATE BONDING EQUIPMENT FOR BONDING SUBSTRATES TO EACH OTHER

CROSS REFERENCE TO RELATED APPLICATION

The present application claims priority to Korean Patent Application No. 10-2020-0185934, filed Dec. 29, 2020, the entire contents of which is incorporated herein for all purposes by this reference.

BACKGROUND OF THE INVENTION

Field of the Invention

The present disclosure relates to a substrate storing and aligning apparatus in substrate bonding equipment for bonding substrates together.

Description of the Related Art

A semiconductor (or display) manufacturing process is a process for manufacturing a semiconductor device on a substrate (e.g., wafer). For example, the semiconductor manufacturing process includes processes of exposure, deposition, etching, ion implantation, cleaning, and the like. In order for connection between chips formed through the semiconductor manufacturing process, a through silicon via (TSV) process has been introduced. The TSV process connects the chips through a through electrode.

For the TSV process, wafer-to-wafer (W2W) bonding for bonding substrates to each other may be performed. Substrate bonding equipment may be provided for bonding the substrates. In the substrate bonding equipment, an equipment layout structure for efficiently performing transfer and processing of a substrate is being studied.

SUMMARY OF THE INVENTION

Accordingly, the present disclosure has been made keeping in mind the above problems occurring in the related art, and the present disclosure is intended to provide a substrate storing and aligning apparatus, which is capable of efficiently using space in substrate bonding equipment.

The problem to be solved is not limited thereto, and other problems not mentioned will be clearly understood by those skilled in the art from the subsequent description.

In order to achieve the above objective, according to one aspect of the present disclosure, there is provided a substrate storing and aligning apparatus in substrate bonding equipment for bonding substrates together, the substrate storing and aligning apparatus including: a front end buffer including a front end storing slot configured to temporarily store a substrate, and a front end opening configured such that a transfer robot may be movable therethrough to transfer the substrate from the front end storing slot; and a front end aligner provided to be stacked on an upper portion of the front end buffer, and configured to rotate the substrate so as to align the substrate.

The front end storing slot may include a plurality of front end storing slots arranged in a vertical direction, and include a front end buffer support member to support the substrate at a lower portion.

The front end opening may include: a first front end opening configured such that an equipment front end module (EFEM) transfer robot may enter therethrough, the EFEM transfer robot being configured to transfer the substrate from an the EFEM, on which the substrate is loaded, to the front end storing slot in the substrate bonding equipment; and a second front end opening configured such that a main transfer robot may enter, the main transfer robot being configured to transfer the substrate from the front end storing slot to the front end aligner.

The front end aligner may include: a front end alignment inspection part configured to inspect an alignment condition of the substrate; and a front end rotation drive part configured to rotate the substrate in response to the alignment condition of the substrate.

The front end alignment inspection part may be configured to inspect whether a notch portion of the substrate may be aligned in a predetermined direction before a plasma processing is performed for the substrate, and the front end rotation drive part may be configured to rotate the substrate so that the notch portion of the substrate may direct in the predetermined direction.

The front end alignment inspection part may be configured to inspect whether, before a bonding inspection for the bonded substrate, the bonded substrate may be aligned in a predetermined direction, and the front end rotation drive part may be configured to rotate the bonded substrate so that the substrate may be aligned in the predetermined direction.

In a substrate storing and aligning apparatus in substrate bonding equipment for bonding substrates together, the substrate storing and aligning apparatus may include: a rear end buffer including a rear end storing slot configured to temporarily store a substrate and a rear end opening configured such that a transfer robot may be movable therethrough to transfer the substrate from the rear end storing slot; a rear end aligner provided to be stacked on the rear end buffer and configured to rotate the substrate to align the substrate; and a cooling member provided to be stacked at a lower portion of the rear end buffer and configured to cool a bonded substrate.

The rear end storing slot may include a plurality of rear end storing slots arranged in a vertical direction, and include a rear end buffer support member to support the substrate at a lower portion.

The rear end opening may include: a first rear end opening configured such that a main transfer robot may enter therethrough to transfer a substrate, on which a plasma processing may be performed, to the rear end storing slot in the substrate bonding equipment; and a second rear end opening configured to be opposite to the first rear end opening, and configured such that a flip transfer robot may enter therethrough to flip the plasma-processed substrate from the rear end storing slot.

The rear end aligner may include: a rear end alignment inspection part configured to inspect an alignment condition of the substrate; and a rear end rotation drive part configured to rotate the substrate in response to the alignment condition of the substrate.

The rear end alignment inspection part may be configured to inspect whether, before a bonding processing for the substrate, the substrate may be aligned in a predetermined direction, and the rear end rotation drive part may be configured to rotate the substrate so that the substrate may direct in the predetermined direction.

The substrate storing and aligning apparatus may include: a thickness inspection part that may be arranged on an upper portion of the rear end aligner and to measure a thickness of the substrate.

Substrate bonding equipment configured to bond substrates together, the substrate bonding equipment including: an equipment front end module (EFEM) on which a substrate may be loaded; an EFEM transfer robot configured to transfer the substrate from the EFEM; a front end substrate storing and aligning module configured to temporarily store the substrate transferred by the EFEM transfer robot and to align the substrate for a subsequent process; a main transfer robot configured to transfer the substrate from the front end substrate storing and aligning module; a plasma processing module configured to perform a plasma processing for the substrate; a rear end substrate storing and aligning module configured to temporarily store the substrate on which the plasma processing may be performed and to align the substrate for the subsequent process; a flip transfer robot configured to flip and transfer the substrate temporarily stored in the rear end substrate storing and aligning module; a bonding module configured to bond the substrates together; and a bonding inspection module configured to inspect a bonding condition between the substrates, wherein the front end substrate storing and aligning module may include: a front end buffer including a front end storing slot configured to temporarily store the substrate and a front end opening through which the EFEM transfer robot and the main transfer robot may be movable from the front end storing slot; and a front end aligner provided to be stacked on an upper portion of the front end buffer, and configured to rotate the substrate so as to align the substrate.

The front end opening may include: a first front end opening configured such that the EFEM transfer robot may enter therethrough; and a second front end opening configured such that the main transfer robot may enter therethrough.

The main transfer robot may be configured to support the substrate through the second front end opening to transfer the substrate to the front end aligner, the front end aligner may be configured to align a notch portion of the substrate for the plasma processing in a predetermined direction, and the main transfer robot may be configured to transfer the aligned substrate to the plasma processing module.

The rear end substrate storing and aligning module may include: a rear end buffer including a rear end storing slot temporarily storing a substrate and a rear end opening through which the main transfer robot and the flip transfer robot may be movable from the rear end storing slot; a rear end aligner provided to be stacked on an upper portion of the rear end buffer and configured to rotate the substrate to align the substrate; a cooling member configured to be tacked at a lower portion of the rear end buffer and configured to cool the bonded substrate; and a thickness inspection part located on an upper portion of the rear end aligner and configured to measure the thickness of the substrate.

The main transfer robot may be configured to support and transfer the substrate from the plasma processing module to the rear end aligner, the rear end aligner may be configured to align the substrate along the bonding module, and the flip transfer robot may be configured to flip and transfer the substrate to the bonding module, and to transfer the bonded substrate to the cooling member.

The main transfer robot may be configured to transfer the bonded substrate from the cooling member to the front end aligner, and the front end aligner may be configured to align the bonded substrate in a predetermined direction.

The main transfer robot may be configured to transfer the bonded substrate aligned by the front end aligner to the bonding inspection module, and the bonding inspection module may be configured to perform a bonding inspection for the bonded substrate.

The main transfer robot may be configured to transfer the bonded substrate, on which the bonding inspection is performed, to the front end buffer, the EFEM transfer robot may be configured to transfer the bonded substrate stored in the front end buffer to the EFEM, and the EFEM may be configured to discharge the bonded substrate.

According to the present disclosure, the buffer temporarily storing the substrate and the aligner aligning the substrate are stacked vertically, so that the space in the substrate bonding equipment can be efficiently used.

The effect of the present disclosure is not limited to the above description, and other effects not mentioned will be clearly understood by those skilled in the art from the subsequent description.

BRIEF DESCRIPTION OF THE DRAWINGS

The above and other objectives, features, and other advantages of the present disclosure will be more clearly understood from the subsequent detailed description when taken in conjunction with the accompanying drawings, in which.

DETAILED DESCRIPTION OF THE INVENTION

Figure 1:
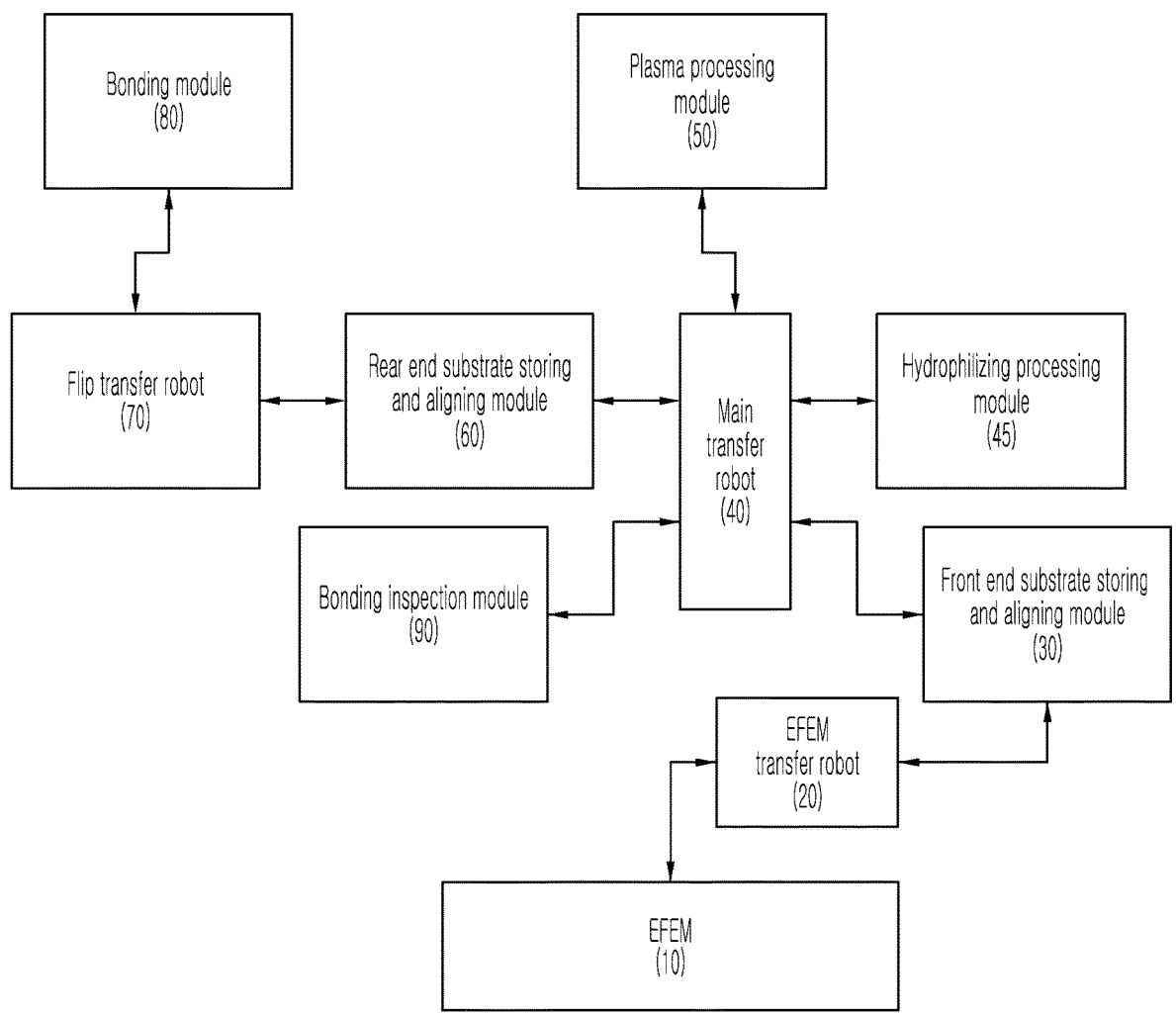
FIG. 1 is a block diagram showing a structure of substrate bonding equipment and a substrate transfer route.

Hereinbelow, exemplary embodiments of the present disclosure will be described in detail with reference to the accompanying drawings such that the present disclosure can be easily embodied by one of ordinary skill in the art to which the present disclosure belongs. However, the present disclosure may be changed to various embodiments and the scope and spirit of the present disclosure are not limited to the embodiments described hereinbelow.

In the subsequent description, if it is decided that the detailed description of known function or configuration related to the present disclosure makes the subject matter of the present disclosure unclear, the detailed description is omitted, and the same reference numerals will be used throughout the drawings to refer to the elements or parts with same or similar function or operation.

Furthermore, in various embodiments, elements with the same configuration will be described in a representative embodiment by using the same reference numeral, and different configurations from the representative embodiment will be described in other embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion such as "between" versus "directly between", "adjacent" versus "directly adjacent", etc. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

In the flowing description, unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a block diagram showing a structure of substrate bonding equipment and a substrate transfer route. According to the embodiment of the present disclosure, the substrate bonding equipment receives a first substrate and a second substrate and bonds the first substrate and the second substrate together so as to output the bonded substrate.

According to the embodiment of the present disclosure, the substrate bonding equipment for bonding the substrates together includes an equipment front end module (EFEM) 10, an EFEM transfer robot 20, a front end substrate storing and aligning module 30, a main transfer robot 40, a plasma processing module 50, a rear end substrate storing and aligning module 60, a flip transfer robot 70, a bonding module 80, and a bonding inspection module 90. The EFEM 10 is configured such that the substrate is loaded thereon. The EFEM transfer robot 20 transfers the substrate from the EFEM 10. The front end substrate storing and aligning module 30 temporarily stores the substrate transferred by the EFEM transfer robot 20 and aligns the substrate for a subsequent process. The main transfer robot 40 transfers the substrate from the front end substrate storing and aligning module 30. The plasma processing module 50 performs the plasma processing for the substrate. The rear end substrate storing and aligning module 60 temporarily stores the plasma-processed substrate and aligns the substrate for the subsequent process. The flip transfer robot 70 flips and transfers the substrate temporarily stored in the rear end substrate storing and aligning module 60. The bonding module 80 performs bonding of the substrates. The bonding inspection module 90 performs a bonding inspection for the substrates. The substrate bonding equipment may include a hydrophilizing processing module 45. The hydrophilizing processing module 45 is provided to hydrophilize a surface of the substrate before the plasma processing.

Meanwhile, the front end substrate storing and aligning module 30 and the rear end substrate storing and aligning module 60 need to perform storing and aligning functions while using minimum space. Therefore, the embodiment of the present disclosure provides the substrate storing and aligning apparatus that may be configured to efficiently use a space by minimizing a used area.

Figure 2:
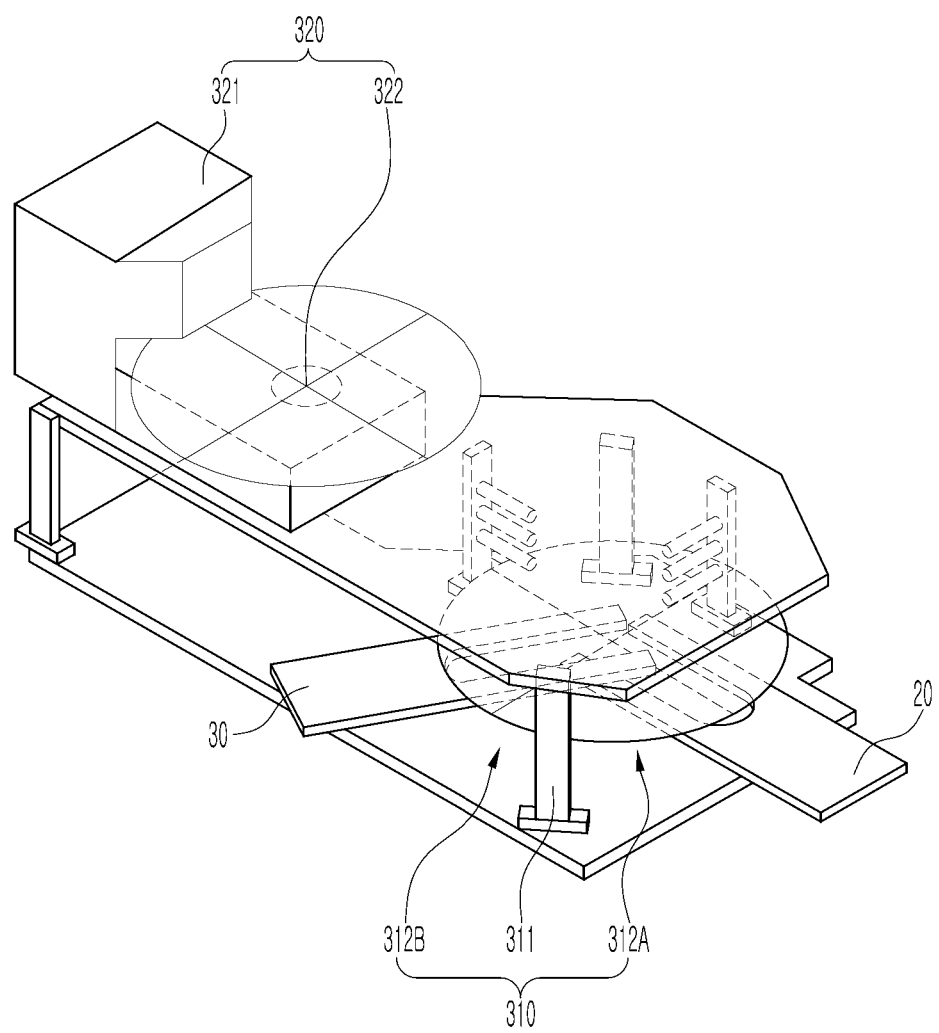
FIGS. 2 and 3 are views showing a structure of a substrate storing and aligning apparatus according to a first embodiment of the present disclosure.
Figure 3:
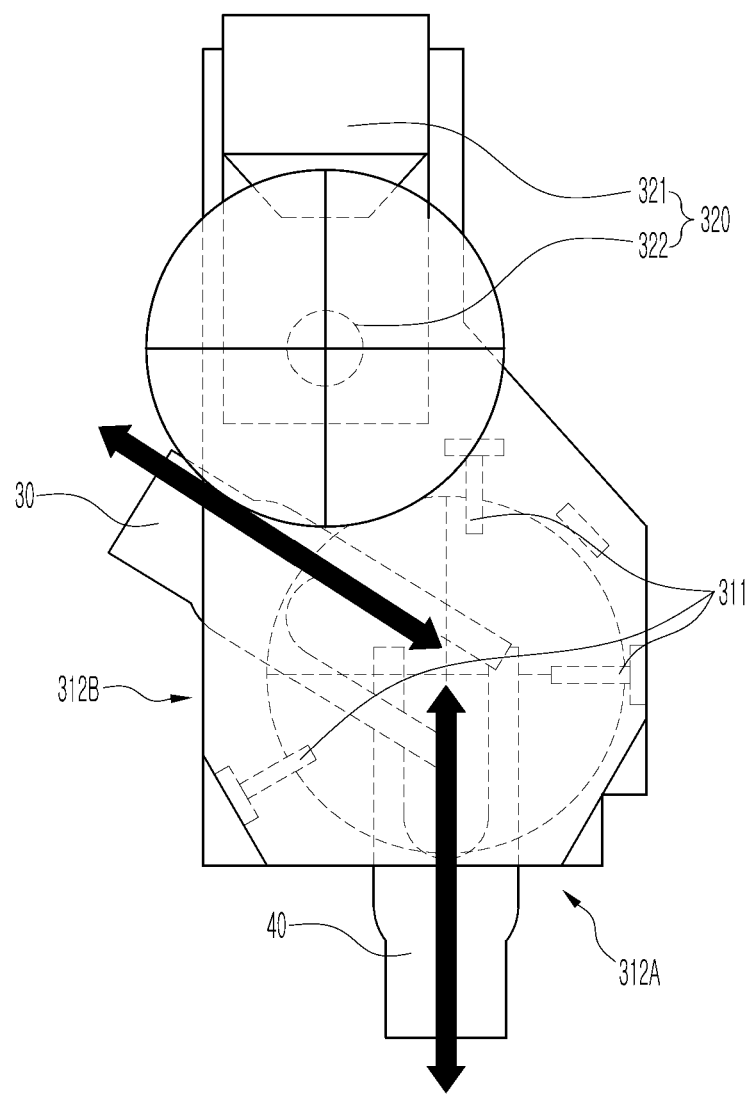

FIGS. 2 and 3 are views showing a structure of a substrate storing and aligning apparatus according to a first embodiment of the present disclosure. The substrate storing and aligning apparatus shown in FIGS. 2 and 3 may be the front end substrate storing and aligning module 30 shown in FIG. 1. FIG. 2 is a perspective view showing the substrate storing and aligning apparatus and FIG. 3 is a top view showing the substrate storing and aligning apparatus.

The substrate storing and aligning apparatus (front end substrate storing and aligning module 30) includes a front end buffer 310 and a front end aligner 320. The front end buffer 310 includes a front end storing slot 311 temporarily storing the substrate and a front end opening 312A, 312B through which a transfer robot 20, 40 that transfers the substrate from the front end storing slot 311 is moved. The front end aligner 320 is stacked on an upper portion of the front end buffer 310 and aligns the substrate by rotating the substrate. As shown in FIGS. 2 and 3, the front end buffer 310 temporarily storing the substrate and the front end aligner 320 performing alignment for substrate processing are arranged while being stacked with each other. Therefore, the substrate storing and aligning apparatus may be provided in the substrate bonding equipment with the minimum space.

The front end storing slot 311 includes a plurality of front end storing slots in a vertically direction and includes a front end buffer support member to support the substrate at a lower portion. As shown in FIG. 2, the front end buffer support member may include support pins for providing the substrate at three points and supports shafts to which the supports pins are provided. Furthermore, the front end buffer support member may include a substrate detection part detecting whether the substrate is loaded on the front end buffer support member.

The front end opening 312 includes a first front end opening 312A and a second front end opening 312B. The first front end opening 312A is configured such that, in the substrate bonding equipment, the EFEM transfer robot 20 transferring the substrate from the EFEM 10 on which the substrate is loaded to the front end storing slot 311 enters therethrough. The second front end opening 312B is configured such that, the main transfer robot 40 transferring the substrate from the front end storing slot to the front end aligner 320 enters therethrough. The EFEM transfer robot 20 may receive the substrate from the EFEM and transfer the substrate to the front end storing slot through the first front end opening 312A. The main transfer robot 40 may receive the substrate from the front end storing slot through the second front end opening 312B and transfer the substrate to the front end aligner 320.

The front end aligner 320 includes a front end alignment inspection part 321 inspecting an alignment condition of the substrate and a front end rotation drive part 322 rotating the substrate in response to the alignment condition of the substrate.

Before transferring the substrate to the plasma processing module 50, the main transfer robot 40 may receive the substrate from the front end storing slot and transfer the substrate to the front end aligner 320 in order to align a notch portion of the substrate in a desired direction. According to the embodiment, the front end alignment inspection part 321 inspects whether the notch portion of the substrate is aligned in the predetermined direction before the plasma processing for the substrate, and the front end rotation drive part 322 rotates the substrate so that the notch portion of the substrate directs in the predetermined direction. When alignment of the substrate is complete, the main transfer robot 40 may receive the substrate from the front end aligner 320 and transfer the substrate to the plasma processing module 50 (or hydrophilizing processing module 45).

Furthermore, the main transfer robot 40 may receive the bonded substrate when the bonding processing is complete from the rear end substrate storing and aligning module 60 to the front end aligner 320. The front end alignment inspection part 321 may inspect whether the bonded substrate is aligned in the predetermined direction before the bonding inspection of the bonded substrate. The front end rotation drive part 322 may rotate the substrate the bonded substrate so that the substrate is aligned in a predetermined alignment. When alignment of the substrate is complete, the main transfer robot 40 may receive the bonded substrate and transfer the bonded substrate to the bonding inspection module 90.

Figure 4:
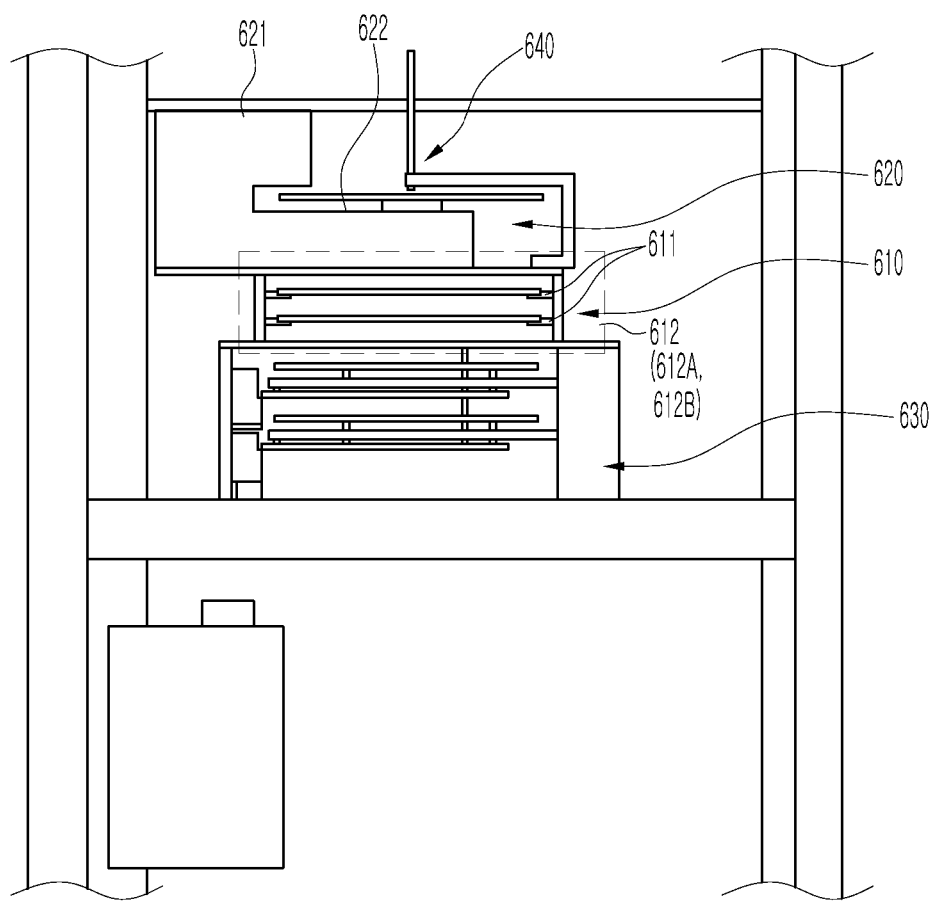
FIG. 4 is a view showing a structure of a substrate storing and aligning apparatus according to a second embodiment of the present disclosure.

FIG. 4 is a view showing a structure of a substrate storing and aligning apparatus according to a second embodiment of the present disclosure. The substrate storing and aligning apparatus in FIG. 4 may be the rear end substrate storing and aligning module 60 shown in FIG. 1. FIG. 4 is a side view showing the rear end substrate storing and aligning module 60.

The substrate storing and aligning apparatus (rear end substrate storing and aligning module 60) includes a rear end buffer 610, a rear end aligner 620, and a cooling member 630. The rear end buffer 610 includes a rear end storing slot 611 temporarily storing the substrate and a rear end opening 612 through which a transfer robot 40, 70 transferring the substrate from the rear end storing slot 611 is moved. The rear end aligner 620 is stacked on an upper portion of the rear end buffer 610 and aligns the substrate by rotating the substrate. The cooling member 630 is stacked on a lower portion of the rear end buffer 610 and cools the bonded substrate. As shown in FIG. 4, the rear end aligner 620, the rear end buffer 610, and the cooling member 630 are stacked with each other. Therefore, the substrate storing and aligning apparatus may be provided in the substrate bonding equipment with the minimum space.

The rear end storing slot 611 includes a plurality of rear end storing slots provided in a vertically direction and includes a rear end buffer support member supporting the substrate at a lower portion. As shown in FIG. 4, the rear end buffer support member may include support pins for providing the substrate at three points and supports shafts to which the supports pins are provided. Furthermore, the rear end buffer support member may include a substrate detection part detecting whether the substrate is loaded on the rear end buffer support member.

The rear end opening 612 includes a first rear end opening 612A and a second rear end opening 612B. The first rear end opening 612A is configured such that the main transfer robot 40, which transfers the substrate that is plasma-processed in the substrate bonding equipment to the rear end storing slot 611, enters therethrough. The second rear end opening 612B is formed at an opposite portion to the first rear end opening 612A and is configured such that the flip transfer robot 70, which flips the plasma-processed substrate, enters therethrough from the rear end storing slot 611.

The rear end aligner 620 includes a rear end alignment inspection part 621 inspecting an alignment condition of the substrate and a rear end rotation drive part 622 rotating the substrate in response to the alignment condition of the substrate. The rear end alignment inspection part 621 inspects whether the substrate is aligned in the predetermined direction before the bonding processing for the substrate. The rear end rotation drive part 622 rotates the substrate so that the substrate directs in the predetermined direction. The substrate, which is processed at a surface thereof by the hydrophilizing processing module 45 and the plasma processing module 50, is transferred to the rear end substrate storing and aligning module 60 by the main transfer robot 40. Then, the substrate is aligned and stored in the rear end substrate storing and aligning module 60.

The substrate storing and aligning apparatus (rear end substrate storing and aligning module 60) may be located on an upper portion of the rear end aligner 620. The substrate storing and aligning apparatus (rear end substrate storing and aligning module 60) may include a thickness detection part 640 measuring the thickness of the substrate. The thickness detection part 640 may measure the thickness of the substrate when the substrate is aligned. The thickness information of the substrate may be used to determine a degree of pressure during the substrate bonding and a location of the substrate. For example, the main transfer robot 40 transfers the plasma-processed substrate to the rear end aligner 620, and in the rear end aligner 620, an alignment and thickness inspection of the substrate is performed. When the alignment and thickness inspection is complete, the main transfer robot 40 transfers the substrate through the first rear end opening 612A to the rear end storing slot 611. The flip transfer robot 70 receives the substrate through the second rear end opening 612B and transfers the substrate to the bonding module 80.

During the substrate bonding, the first substrate is located at the upper side and the second substrate is located at the lower side. When the upper substrate is pressed downward, the substrate bonding may be performed. The upper substrate may be arranged while being turned over. The flip transfer robot 70 may flip the substrate, which will be located at the upper side, and locate the substrate at an upper chuck.

Figure 5:
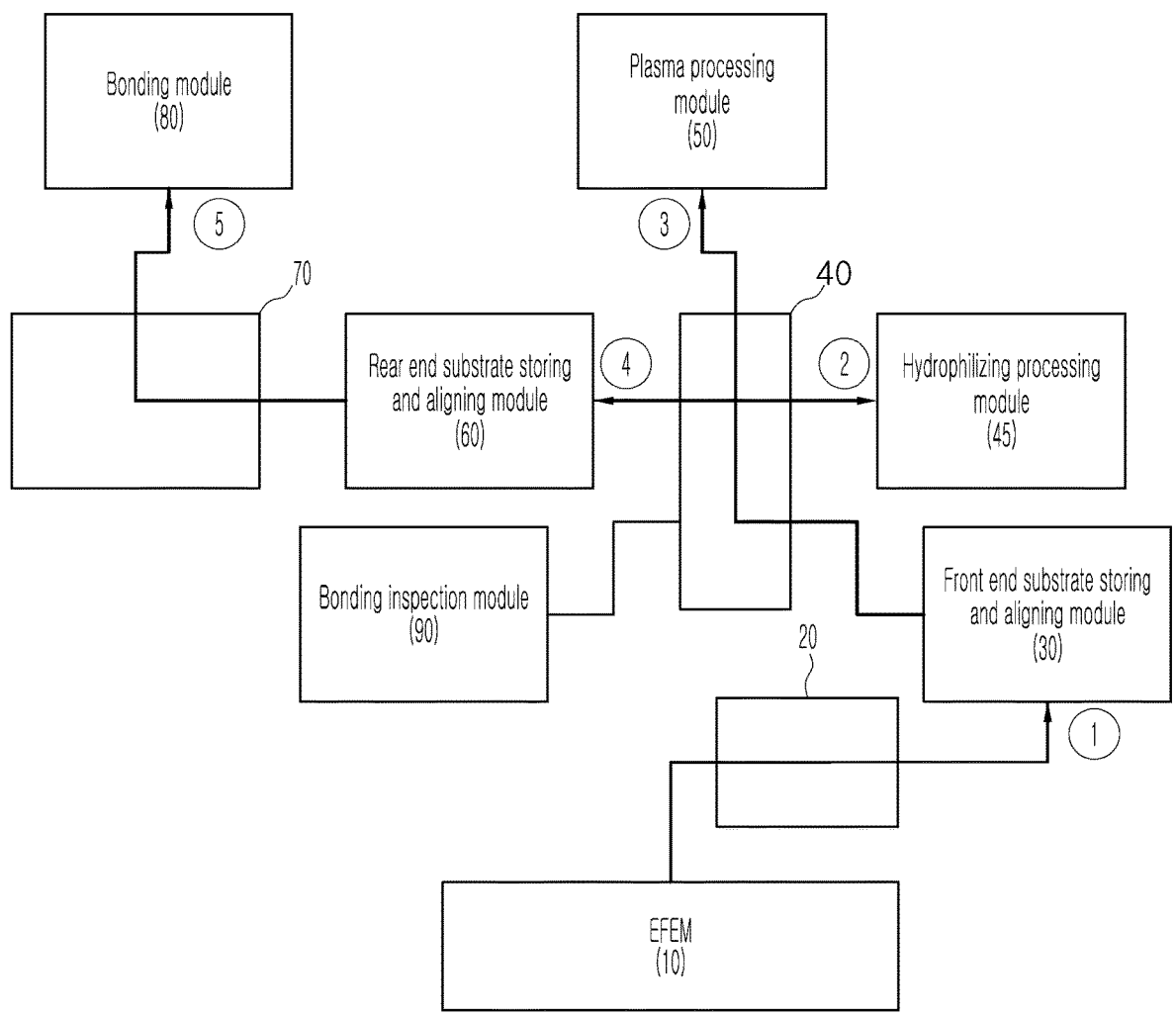
FIGS. 5 and 6 are views showing a substrate transfer route for bonding of substrates.
Figure 6:
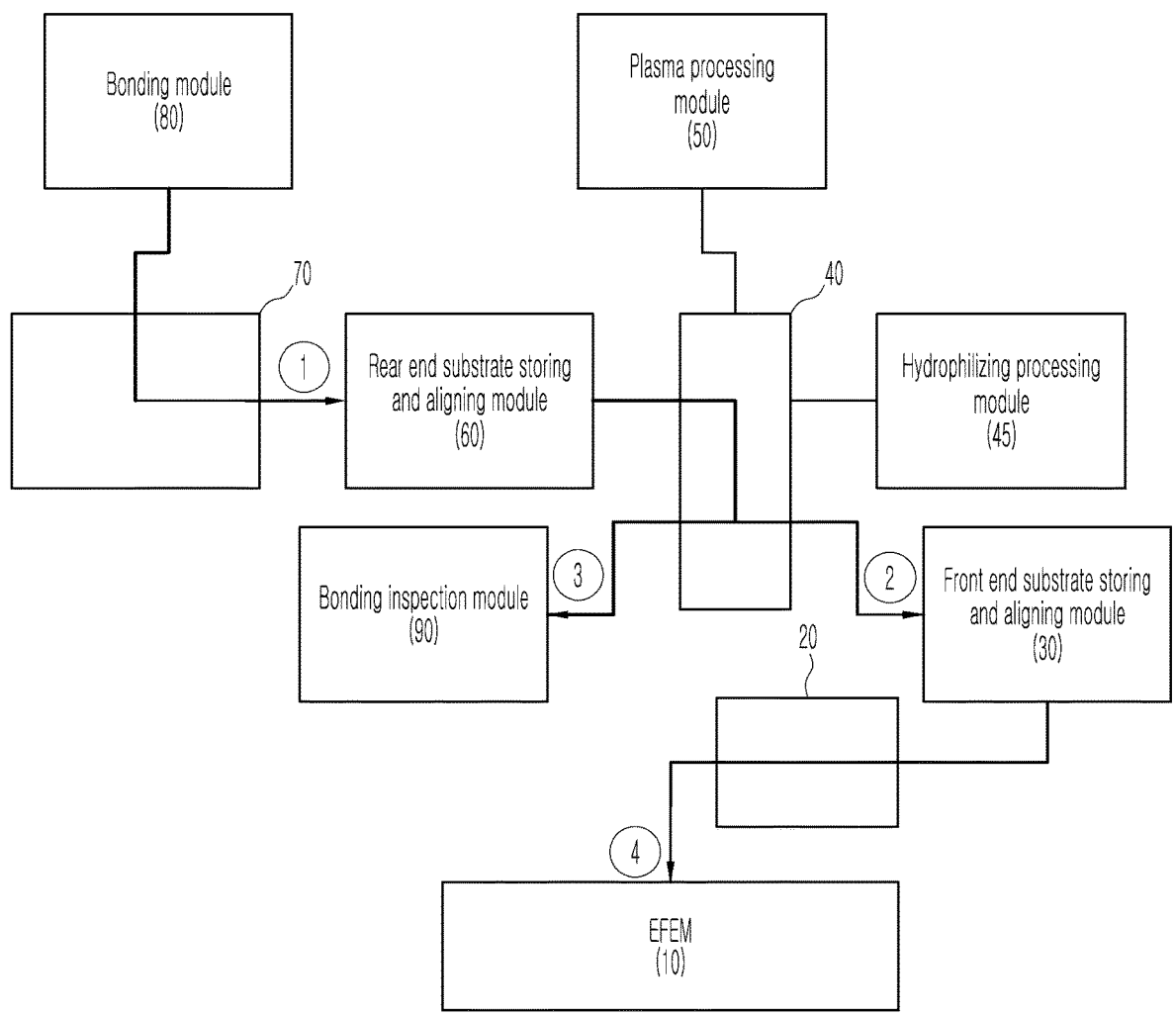

FIGS. 5 and 6 are views showing a substrate transfer route for bonding of substrates. FIG. 5 shows a route along which each substrate is transferred before substrate bonding. FIG. 6 shows a route along which the substrates bonded in the bonding process is transferred.

As described above, the present disclosure includes the EFEM 10, the EFEM transfer robot 20, the front end substrate storing and aligning module 30, the main transfer robot 40, the plasma processing module 50, the rear end substrate storing and aligning module 60, the flip transfer robot 70, the bonding module 80, and the bonding inspection module 90. The EFEM 10 is configured such that the substrate is loaded thereon. The EFEM transfer robot 20 transfers the substrate from the EFEM 10. The front end substrate storing and aligning module 30 temporarily stores the substrate that is transferred by the EFEM transfer robot 20 and aligns the substrate for a subsequent process. The main transfer robot 40 transfers the substrate from the front end substrate storing and aligning module 30. The plasma processing module 50 performs the plasma processing for the substrate. The rear end substrate storing and aligning module 60 temporarily stores the plasma-processed substrate and aligns the substrate for a subsequent process. The flip transfer robot 70 flips and transfers the substrate temporarily stored in the rear end substrate storing and aligning module 60. The bonding module 80 performs bonding of the substrates. The bonding inspection module 90 performs the bonding inspection for the substrates. The substrate bonding equipment may include a hydrophilizing processing module 45. The hydrophilizing processing module 45 is provided to hydrophilize a surface of the substrate before the plasma processing.

Referring to FIG. 5, the substrate loaded on the EFEM 10 is transferred by the EFEM transfer robot 20 to the front end substrate storing and aligning module 30. As described above with reference to FIGS. 2 and 3, the front end substrate storing and aligning module 30 includes the front end buffer 310 and the front end aligner 320. The front end buffer 310 includes the front end storing slot 311 temporarily storing the substrate and the front end opening 312 through which the EFEM transfer robot 20 and the main transfer robot 40 are movable from the front end storing slot 311. The front end aligner 320 is stacked on the upper portion of the front end buffer 310 and aligns the substrate by rotating the substrate.

The front end opening 312 includes the first front end opening 312A through which the EFEM transfer robot 20 enters and the second front end opening 312B through which the main transfer robot 40 enters.

The main transfer robot 40 may support and transfer the substrate through the second front end opening 312B to the front end aligner 320. The front end aligner 320 may align the notch portion of the substrate in the predetermined direction for the plasma processing. The main transfer robot 40 may transfer the aligned substrate to the hydrophilizing processing module 45 and the plasma processing module 50.

The substrate on which the hydrophilizing processing and the plasma processing are complete is transferred to the rear end substrate storing and aligning module 60 by the main transfer robot 40. The rear end substrate storing and aligning module 60 includes the rear end buffer 610, the rear end aligner 620, the cooling member 630, and the thickness detection part 640. The rear end buffer 610 includes the rear end storing slot 611 temporarily storing the substrate and the rear end opening through which the main transfer robot 40 and the flip transfer robot 70 transferring the substrate are movable from the rear end storing slot 611. The rear end aligner 620 is stacked on an upper portion of the rear end buffer 610 and aligns the substrate by rotating the substrate. The cooling member 630 is stacked on a lower portion of the rear end buffer 610 and cools the bonded substrate. The thickness detection part 640 is located on the upper portion of the rear end aligner 620 and measures the thickness of the substrate.

The main transfer robot 40 may support and transfer the substrate from the plasma processing module 50 to the rear end aligner 620. The rear end aligner 620 may align the substrate along the bonding module 80. The flip transfer robot 70 may flip and transfer the substrate the bonding module 80, and transfer the bonded substrate to the cooling member 630.

As shown in FIG. 6, after the bonded substrate is aligned by the front end aligner 320 of the front end substrate storing and aligning module 30, the substrate is transferred to the bonding inspection module 90 and the bonding inspection is performed for the substrate. The substrate on which the bonding inspection is complete is stored in the front end buffer 310 of the front end substrate storing and aligning module 30, and then the substrate is transferred to the EFEM by the EFEM transfer robot 20.

The main transfer robot 40 transfers the substrate aligned by the front end aligner 320 to the bonding inspection module 90. The bonding inspection module 90 performs the bonding inspection for the bonded substrate.

Then, the main transfer robot 40 may transfer the bonded substrate, on which the bonding inspection is performed, to the front end buffer 310. The EFEM transfer robot 20 may transfer the bonded substrate, which is stored in the front end buffer 310, to the EFEM 10. The EFEM 10 may discharge the bonded substrate. The bonded substrate may be discharged by a transfer vehicle (e.g., OHT) located outside the substrate bonding equipment or an operator. Another substrate may be loaded by the OHT or the operator.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific forms without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A substrate bonding equipment for bonding substrates together with each other, the substrate bonding equipment comprising:
   an equipment front end module (EFEM) on which a substrate 1s loaded;
   an EFEM transfer robot configured to transfer the substrate from the EFEM;
   a front end substrate storing and aligning module configured to temporarily store the substrate transferred by the EFEM transfer robot and to align the substrate for a subsequent process;
   a main transfer robot configured to transfer the substrate from the front end substrate storing and aligning module;
   a plasma processing module configured to perform a plasma processing for the substrate;
   a rear end substrate storing and aligning module configured to temporarily store the substrate on which the plasma processing is performed and to align the substrate for the subsequent process;
   a flip transfer robot configured to pick up the substrate temporarily stored in the rear end substrate storing and aligning module and flip and transfer the substrate temporarily stored in the rear end substrate storing and aligning module;
   a bonding module configured to receive the substrate from the flip transfer robot and bond the substrate to another substrate in the bonding module to form bonded substrates; and
   a bonding inspection module configured to inspect a bonding condition between the bonded substrates,
   wherein the front end substrate storing and aligning module comprises:
   a front end buffer comprising a front end storing slot configured to temporarily store the substrate and a front end opening through which the EFEM transfer robot and the main transfer robot are movable from the front end storing slot; and
   a front end aligner provided to be stacked on an upper portion of the front end buffer, and configured to rotate the substrate so as to align the substrate, and
   wherein the rear end substrate storing and aligning module comprises:
   a rear end buffer comprising a rear end storing slot temporarily storing the substrate and a rear end opening through which the main transfer robot and the flip transfer robot are movable from the rear end storing slot; and
   a rear end aligner provided to be stacked on an upper portion of the rear end buffer and configured to rotate the substrate to align the substrate.

2. The substrate bonding equipment of claim 1, wherein the rear end substrate storing and aligning module further comprises:

a cooling member configured to be tacked at a lower portion of the rear end buffer and configured to cool the bonded substrates; and a thickness inspection part located on an upper portion of the rear end aligner and configured to measure a thickness of the substrate.

3. The substrate bonding equipment of claim 2, wherein the main transfer robot is configured to support and transfer the substrate from the plasma processing module to the rear end aligner, wherein the rear end aligner is configured to align the substrate along the bonding module, and wherein the flip transfer robot is configured to flip and transfer the substrate to the bonding module, and to transfer the bonded substrates to the cooling member.

4. The substrate bonding equipment of claim 3, wherein the main transfer robot is configured to transfer the bonded substrates from the cooling member to the front end aligner, and wherein the front end aligner is configured to align the bonded substrates in a predetermined direction.

5. The substrate bonding equipment of claim 4, wherein the main transfer robot is configured to transfer the bonded substrates aligned by the front end aligner to the bonding inspection module, and wherein the bonding inspection module is configured to perform a bonding inspection for the bonded substrates.

6. The substrate bonding equipment of claim 5, wherein the main transfer robot is configured to transfer the bonded substrates, on which the bonding inspection is performed, to the front end buffer, and wherein the EFEM transfer robot is configured to transfer the bonded substrates stored in the front end buffer to the EFEM, and the EFEM is configured to discharge the bonded substrates.

* * * * *